United States Patent
Preusse et al.

(10) Patent No.: US 7,781,329 B2
(45) Date of Patent: Aug. 24, 2010

(54) REDUCING LEAKAGE IN DIELECTRIC MATERIALS INCLUDING METAL REGIONS INCLUDING A METAL CAP LAYER IN SEMICONDUCTOR DEVICES

(75) Inventors: Axel Preusse, Radebeul (DE); Markus Nopper, Dresden (DE); Thomas Ortleb, Dresden (DE); Juergen Boemmels, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/425,498

(22) Filed: Apr. 17, 2009

(65) Prior Publication Data

US 2009/0325375 A1 Dec. 31, 2009

(30) Foreign Application Priority Data

Jun. 30, 2008 (DE) .................. 10 2008 030 849

(51) Int. Cl.
*H01L 21/4763* (2006.01)
(52) U.S. Cl. .................. 438/625; 438/637; 438/645; 438/660; 438/675
(58) Field of Classification Search ............ 438/625, 438/626, 631, 634, 637, 645, 660, 663, 675, 438/667, 678, 687
See application file for complete search history.

(56) References Cited

U.S. PATENT DOCUMENTS

| | | | | |
|---|---|---|---|---|
| 6,184,124 B1* | 2/2001 | Hasegawa et al. | ........... | 438/625 |
| 7,338,908 B1 | 3/2008 | Koos et al. | .................. | 438/745 |
| 7,476,974 B2* | 1/2009 | Andreyushchenko et al. | .......................... | 438/637 |
| 2003/0089928 A1 | 5/2003 | Saito et al. | .................. | 257/213 |
| 2003/0190426 A1* | 10/2003 | Padhi et al. | ................. | 427/307 |
| 2005/0085031 A1 | 4/2005 | Lopatin et al. | .............. | 438/222 |
| 2006/0001170 A1 | 1/2006 | Zhang et al. | ................ | 257/762 |
| 2006/0205204 A1* | 9/2006 | Beck | ......................... | 438/628 |

FOREIGN PATENT DOCUMENTS

WO WO 01/08213 A1 2/2001

OTHER PUBLICATIONS

Translation of Official Communication from German Patent Office for German Patent Application No. 10 2008 030 849.8 dated Mar. 19, 2009.
Translation of Official Communication from German Patent Office for German Patent Application No. 10 2008 030 849.8 dated Jan. 28, 2010.

* cited by examiner

*Primary Examiner*—Kevin M Picardat
(74) *Attorney, Agent, or Firm*—Williams, Morgan & Amerson, P.C.

(57) ABSTRACT

By introducing an additional heat treatment prior to and/or after contacting a sensitive dielectric material with wet chemical agents, such as an electrolyte solution, enhanced performance with respect to leakage currents or dielectric strength may be accomplished during the fabrication of advanced semiconductor devices. For example, metal cap layers for metal lines may be provided on the basis of electroless deposition techniques, wherein the additional heat treatment(s) may provide the required electrical performance.

24 Claims, 5 Drawing Sheets

REDUCING LEAKAGE IN DIELECTRIC MATERIALS INCLUDING METAL REGIONS INCLUDING A METAL CAP LAYER IN SEMICONDUCTOR DEVICES

BACKGROUND OF THE INVENTION

1. Field of the Invention

Generally, the present disclosure relates to microstructures, such as advanced integrated circuits, and, more particularly, to the formation of conductive structures, such as copper-based metallization layers having enhanced performance with respect to electro-migration by providing a metal cap layer on the metal regions.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases more rapidly than the number of circuit elements. Thus, a plurality of stacked "wiring" layers, also referred to as metallization layers, are usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines, which may even increase with every new device generation.

Advanced integrated circuits, including transistor elements having a critical dimension of 0.05 µm and even less, may, therefore, typically be operated at significantly increased current densities of up to several kA per $cm^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced mass transport in metal lines and vias, also referred to as "electromigration." Electromigration is caused by momentum transfer of electrons to the ion cores, resulting in a net momentum in the direction of electron flow. In particular, at high current densities, a significant collective motion or directed diffusion of atoms may occur in the interconnect metal, wherein the presence of diffusion paths may have a substantial influence on the displaced amount of matter resulting from the momentum transfer. Thus, electromigration may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.1 µm or less, may require significantly reduced cross-sectional areas of the metal lines and, thus, increased current densities, which may render aluminum less attractive for the formation of metallization layers.

Consequently, aluminum is being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant material transport at the interface, which is typically a critical region in view of increased diffusion paths that may facilitate current-induced material diffusion. Currently, tantalum, titanium, tungsten and their compounds with nitrogen and silicon and the like are preferred candidates for a conductive barrier layer, wherein the barrier layer may comprise two or more sub-layers of different composition to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less in combination with trenches having a width ranging from 0.1 μm to several μm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in combination with low-k dielectric materials having a relative permittivity of 3.1 or even less, in order to find new materials and process strategies for forming copper-based lines and vias with a low overall permittivity. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One failure mechanism, which is believed to significantly contribute to a premature device failure, is the electromigration-induced material transport, particularly along an interface formed between the copper and a dielectric cap layer, which may be provided after filling in the copper material in the trenches and via openings, the sidewalls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and silicon carbon nitride, which exhibit a moderately high etch selectivity to typically employed interlayer dielectrics, such as a plurality of low-k dielectric materials, and also suppress the diffusion of copper into the interlayer dielectric. Recent research results seem to indicate, however, that the interface formed between the copper and dielectric cap layer is a major diffusion path for material transport during operation of the metal interconnect.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly increasing the overall resistance of the corresponding metal line. For instance, a compound of cobalt/tungsten/phosphorous (CoWP) has proven to be a promising candidate for conductive cap layers, which may significantly reduce electromigration effects within a corresponding metal line. Although the compound of cobalt/tungsten/phosphorous provides superior electro-migration performance and may be implemented into the overall process flow for manufacturing complex metallization systems, since this compound may readily be deposited on the basis of selective electrochemical deposition recipes, it turns out, however, that severe defects may be observed in metallization systems including copper lines with a conductive cap layer. For example, increased leakage currents and dielectric breakdown may occur in such devices compared to devices having a metallization system based on a dielectric cap layer. Since electrochemical deposition techniques, such as electroless plating and the like, may gain in importance in future device generations and due to the fact that the overall electromigration behavior of electrochemically selectively deposited metal cap layers may be enhanced for metal lines in sophisticated metallization systems, great efforts are being made in developing process strategies for increasing the dielectric characteristics of dielectric materials that come into contact with electrolyte solutions during sophisticated deposition regimes in an attempt to reduce leakage currents and degradation of the dielectric characteristics.

The present disclosure is directed to various methods and techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques for increasing the dielectric characteristics, i.e., the behavior with respect to the response of dielectric materials to applied voltages and with respect to reducing parasitic leakage currents in the dielectric materials by introducing an appropriately designed heat treatment at an appropriate stage of a process sequence involving the exposure of sensitive dielectric materials to wet chemical solutions, such as electrolyte solutions and the like. In some illustrative aspects disclosed herein, the electrochemical deposition of metals, such as metal cap layers, underbump metallization layers and the like, may be accomplished with enhanced process results with respect to dielectric strength and leakage currents by performing the heat treatment prior to and/or after the electrochemical deposition process, thereby conditioning the state of the dielectric material to meet tightly set specifications with respect to voltage ramp dielectric breakdown (VRDB) tests and leakage tests as may be required for sophisticated semiconductor devices corresponding to the 45 nm technology and beyond. Without intending to restrict the present disclosure to any explanation, it is believed that the additional heat treatment may remove remaining humidity in the dielectric material which, in sophisticated applications, may exhibit a more or less pronounced porous state, which may otherwise support currents through dissolved ionic species incorporated during the electrochemical deposition process. Consequently, promising electrochemical deposition regimes may be incorporated into sophisticated overall manufacturing flows for forming metallization systems, contact levels and the like, wherein the superior characteristics in view of electromigration and the like may be combined with dielectric characteristics, for instance, with respect to reduced leakage currents and increased dielectric strength.

One illustrative method disclosed herein comprises performing a process sequence on a semiconductor device, wherein the process sequence includes a subset of processes for applying a wet chemical solution on a first dielectric material and removing the wet chemical solution from the dielectric material. The method further comprises performing a heat treatment in an oxygen-depleted ambient and forming a second dielectric material at least on the first dielectric material after the heat treatment.

A further illustrative method disclosed herein comprises performing a heat treatment with a process temperature of approximately 100-400° C. on a first dielectric material of a semiconductor device after contact of the dielectric material with a wet chemical agent. Additionally, the method comprises forming a second dielectric material on the first dielectric material.

A still further illustrative method disclosed herein comprises performing a process sequence for forming a metal region in a dielectric material of a metallization system of a semiconductor device, wherein the process sequence comprises at least one process that exposes a surface of the dielectric material to a wet chemical agent. The method further comprises forming a metal-containing layer on the metal region by performing an electro-chemical deposition process and performing a first heat treatment after forming the metal-containing layer.

BRIEF DESCRIPTION OF THE DRAWINGS

The disclosure may be understood by reference to the following description taken in conjunction with the accompanying drawings, in which like reference numerals identify like elements, and in which.

Figure 1A:
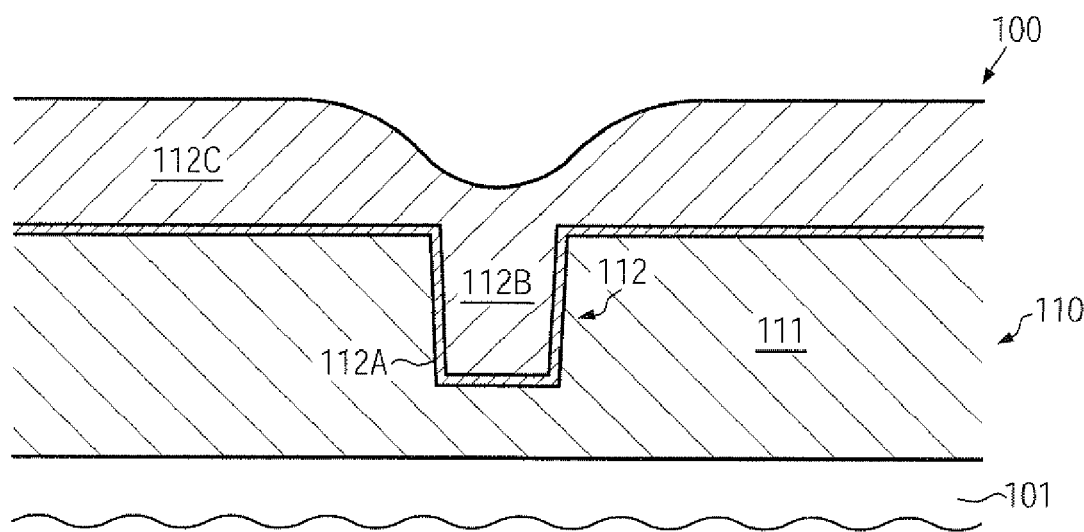
FIGS. 1a-1b schematically illustrate cross-sectional views of a semiconductor device during a first process sequence in which a dielectric material may be exposed to wet chemical agents, such as water, cleaning agents and the like, during the formation of a metal region in a dielectric material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques for conditioning dielectric materials, such as low-k dielectric materials, which are to be understood as dielectric materials having a dielectric constant of 3.0 and less, which may be provided in a more or less porous state, after contact with wet chemical solutions, such as water, reactive chemicals, electrolyte solutions and the like. During the fabrication of sophisticated semiconductor devices, frequently, dielectric materials have to be exposed to wet chemical solutions during cleaning processes, electrochemical deposition processes and the like, wherein inferior behavior with respect to dielectric strength and the like may be observed, in particular when reduced device dimension may be required by the design rules. As previously explained, electroless deposition techniques, i.e., the deposition of a metal or metal-containing material on the basis of an electrolyte solution without requiring an external current source, may represent a promising deposition technique for a plurality of applications, such as the provision of metal cap layers for the metal lines, metals of contact structures, underbump metallization layers, i.e., metallization layers formed under solder bumps, or any other contact bumps above the last metallization level and the like. Although the exact mechanism of deteriorating overall dielectric characteristics of the materials may not be understood, it is believed that, depending on the initial condition of dielectric materials, such as the degree of porosity, surface texture and the like, traces of humidity, in combination with any dissolved ionic species, which may, for instance, be incorporated during any preceding manufacturing processes, such as rinsing, contact with wet chemical solutions and the like, may result in an increase of leakage paths which may, particularly at very reduced device dimensions, contribute to overall device degradation so that frequently the set specifications during the manufacturing process may not be met. It is believed that, due to the principles disclosed herein, enhanced surface conditions may be established by using an appropriately designed heat treatment at appropriate manufacturing stages, in particular after a process sequence for depositing a metal-containing material on the basis of electrochemical deposition techniques.

For this purpose, in some illustrative embodiments, a heat treatment with a temperature of approximately 100-400° C. may be incorporated into the manufacturing flow in an oxygen-depleted ambient, which is to be understood as any process ambient in which the fraction of oxygen may be reduced to 50 ppm (parts per million) relative to a standard clean room ambient, thereby further enhancing the overall effect of the surface conditioning. It should be appreciated that a low pressure ambient with a remaining pressure of less than several mTorr may also be understood as an oxygen-depleted ambient. In some illustrative embodiments, one or more heat treatments are incorporated into a manufacturing flow for forming a metal-containing cap layer of metal regions in advanced metallization systems, wherein one heat treatment may be performed after completing the basic metal region and wherein one heat treatment may be performed after completing the electrochemical deposition of the cap layer, including the cleaning and rinsing of the resulting surface of the semiconductor device, wherein when both heat treatments are used in the manufacturing sequence, even further enhanced efficiency with respect to reducing leakage currents may be achieved. In other cases, a corresponding heat treatment may be performed in a manufacturing sequence for forming a metal cap layer in sophisticated contact structures, wherein enhanced conductivity may be obtained by using highly conductive metals, such as copper and the like, while nevertheless an efficient confinement of the reactive metal may be accomplished by using metal cap layers provided by electrochemical deposition, wherein, due to the principles disclosed herein, a desired performance with respect to leakage currents and dielectric strength may be accomplished, even for advanced semiconductor devices requiring a lateral distance of contact elements of approximately 100 nm and less.

In still other illustrative embodiments disclosed herein, the heat treatment may be provided at any manufacturing stage in which contact of a dielectric material with wet chemical solution may affect the further processing with respect to increased leakage currents, thereby providing enhanced yield for sophisticated manufacturing strategies. Furthermore, the principles disclosed herein may also be applied at higher device levels, such as the last metallization layer, in which frequently bumps, such as solder bumps, may be provided on respective contact pads, wherein typically a so-called underbump metallization material may be required in order to provide the desired mechanical and electrical interface characteristics between the bump material and the contact pad. Also in this case, increasingly, electroless deposition techniques may be used for forming the interface material, which may affect the surrounding dielectric material. Consequently, by applying one or more heat treatments in this device level, significant improvements may also be accomplished with respect to the overall electrical behavior.

FIG. 1a schematically illustrates a semiconductor device 100 comprising a substrate 101, which may represent any appropriate carrier material for forming thereon and therein circuit elements, such as transistors, capacitors and the like, as may typically be required for advanced integrated circuits. It should be appreciated that, in FIG. 1a, the substrate 101 should be understood so as to include one or more device levels, such as a semiconductor layer including circuit elements, possibly in combination with a contact layer, as will be described later on in more detail, and one or more metallization layers. Furthermore, a device level 110, which may be understood as a layer of one or more materials comprising at least one dielectric material 111, may be provided above the substrate 101. In one illustrative embodiment, the device level 110 may represent a metallization layer of a metallization system of the device 100. In this case, typically, the dielectric material 111 may represent a low-k dielectric material, at least partially, depending on the overall device requirements. For example, a plurality of low-k dielectric materials having a dielectric constant of 3.0 and less may be used, such as silicon dioxide-based materials, polymer materials and the like. As previously explained, in many cases, the dielectric material may have a more or less porous state at least locally, for instance at surface areas thereof, which may also include more or less damaged areas caused by any preceding aggressive manufacturing processes, such as etching, polishing and the like. Moreover, in the embodiment shown, the device level 110 may comprise a metal region 112 at an earlier manufacturing stage, which may comprise a conductive barrier material 112A and a highly conductive metal 112B, for instance copper, a copper alloy, silver and the like. In the manufacturing stage shown, excess material may still be formed above the dielectric material 111 and may be separated therefrom by the conductive barrier layer 112A. It should be appreciated that the barrier material 112A may be comprised of two or more layers, depending on the overall characteristics of the dielectric material 111, the metal 112B and the like. For instance, tantalum, tantalum nitride and the like are presently frequently used conductive barrier materials in the context of copper-based metallization systems.

The semiconductor device 100 as illustrated in FIG. 1a may be formed on the basis of the following processes. After fabricating any circuit elements in a lower lying device level, which may be incorporated in the substrate 101, the device level 110 may be formed, for instance, by depositing the dielectric material 111 on the basis of any well-established deposition technique, such as chemical vapor deposition (CVD), spin-on techniques and the like, wherein it should be appreciated that the dielectric material 111 may comprise two or more different materials and layers, depending on the overall configuration of the device level 110. Thereafter, complex lithography techniques may be used in order to provide an etch mask for forming an opening in the dielectric material 111 in accordance with design rules, such as a trench for a metal line and the like. The patterning process for the dielectric material 111 may include sophisticated etch techniques, which may result in a certain degree of damage of the dielectric material 111, in particular when highly sensitive low-k dielectrics are considered. Thereafter, the barrier material 112A may be deposited, for instance, by CVD, self-limiting CVD techniques, such as atomic layer deposition (ALD), physical vapor deposition, electrochemical deposition and the like. Next, in some approaches, a seed layer may be provided on the barrier layer 112A, while in other cases the metal 112B may be directly deposited on the barrier material, depending on the overall process strategy. Next, the metal 112B may be deposited, typically on the basis of electrochemical deposition techniques, such as electroplating, electroless plating and the like. During an electroplating process, the barrier layer 112A, possibly in combination with the seed layer, may be used as a current distribution layer, while in electroless deposition regimes the barrier material 112A or the optional seed material may be used as a catalyst material for initiating the electroless deposition on the basis of well-established electrolyte solutions. During the deposition, typically, the excess material 112C may have to be provided in order to reliably fill the corresponding openings in the dielectric material 111. Thereafter, the excess material 112C and the portion of the barrier layer 112A formed on horizontal areas of the dielectric material 111 may be removed.

Figure 1B:
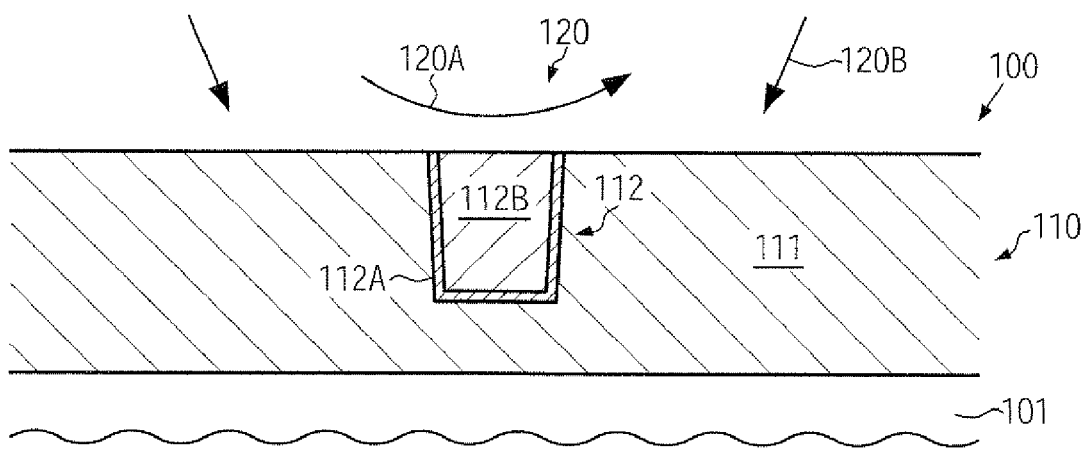

FIG. 1b schematically illustrates the semiconductor device 100 during a plurality of process steps 120, which may include an efficient removal process 120A, for instance based on electrochemical etch techniques, electrochemical polishing, chemical mechanical polishing (CMP) and the like. For instance, frequently, the remaining material 112C and the barrier material 112A may be removed on the basis of an appropriately designed CMP sequence, thereby providing the electrically isolated metal region 112B. Furthermore, during the respective process steps of the process 120A and after the process 120A, additional processes 120B may be provided, for instance rinsing with de-ionized water, providing a cleaning agent in order to remove any contaminants, which may have been created during the preceding process steps 120A and the like. The process 120B may also comprise process steps for applying the corresponding wet chemical agent, such as water and the like, with a subsequent treatment at elevated temperatures for drying the exposed surface of the semiconductor device 100.

Figure 1C:
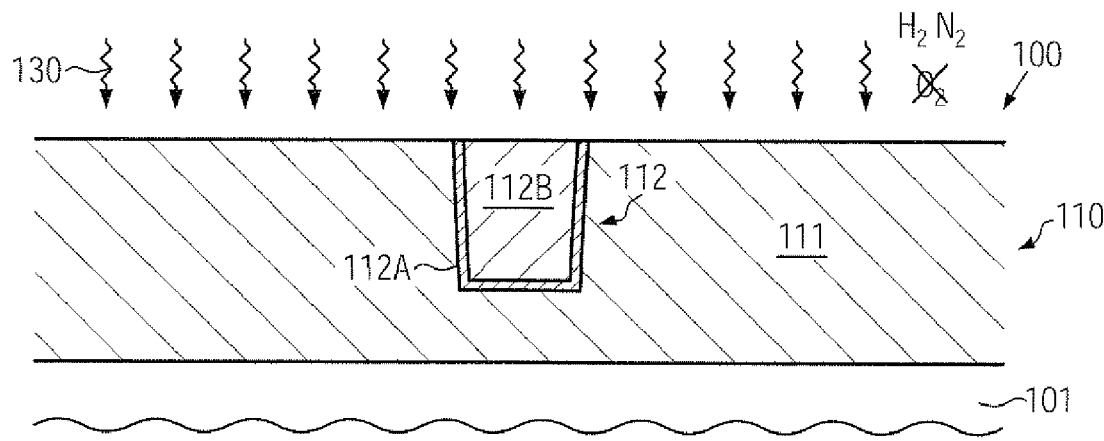
FIG. 1c schematically illustrates the semiconductor device, according to one illustrative embodiment, in which a heat treatment may be performed to provide enhanced dielectric characteristics prior to the deposition of a metal cap layer.

FIG. 1c schematically illustrates the semiconductor device 100 according to one illustrative embodiment in which, in this manufacturing stage, a heat treatment 130 may be applied. The heat treatment 130 may be designed so as to efficiently condition the exposed surface of the dielectric material 111 by using a process temperature of approximately 100-400° C. In this case, the process temperature is to be understood as the temperature of a corresponding process tool in which an ambient that is in contact with the device 100 may have a desired temperature. For example, in one illustrative embodiment, the heat treatment 130 may be performed in a furnace, the heating zones of which may be adjusted to the desired process temperature in the above-specified range. In other cases, hot plates may be used in which the substrate 101, i.e., a portion thereof acting as a carrier material, may be brought into direct contact with the heating surface so as to also raise the temperature of the dielectric material 111. The heat treatment 130 may be performed for approximately 3-120 minutes, thereby essentially establishing a thermal equilibrium between the ambient providing the elevated temperature, such as the furnace or a hot plate, and the dielectric material 111. In some illustrative embodiments, the heat treatment 130 may be performed in an oxygen-depleted ambient, which is to be understood as an ambient in the above-defined sense, thereby reducing the interaction of oxygen with reactive components of the metal region 112 and the dielectric material 111, for example in the form of any residues incorporated during the preceding manufacturing sequence. In one illustrative embodiment, the heat treatment 130 may be performed by establishing a reducing ambient, i.e., a gas ambient including a species that may act as an electron donator with respect to components contained in the metal region 112 and the dielectric material 111. For example, a forming gas, i.e., a mixture of hydrogen and nitrogen, may be used, while in other cases any other appropriate reducing gas components may be applied during the heat treatment 130. It should be appreciated that, in some illustrative embodiments, the heat treatment 130 may be optional in this manufacturing stage and a corresponding heat treatment may be performed in a later stage, as will be described later on.

Figure 1D:
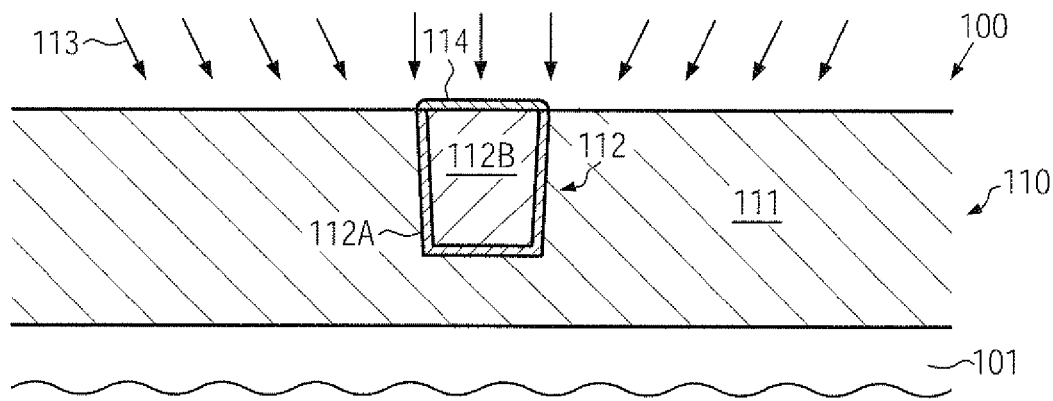
FIGS. 1d-1e schematically illustrate cross-sectional views of the semiconductor device during a further process sequence in which the dielectric material may be exposed to an electrochemical solution for forming a metal-containing cap layer, according to illustrative embodiments.

FIG. 1d schematically illustrates the semiconductor device 100 in a further advanced manufacturing stage in which an electrochemical deposition process 113 may be performed in order to provide a metal cap layer 114, at least on the metal material 112B. As previously explained, a plurality of metal-containing materials, such as alloys in the form of cobalt, tungsten, phosphorous and many others, may be deposited on the basis of electroless deposition recipes in which the exposed portion of the metal 112B may act as a catalyst material in order to initiate a selective deposition of metal-containing material, while substantially avoiding deposition of the metal at the exposed portions of the dielectric material 111. Consequently, during the deposition process 113, the dielectric material 111 may be in direct contact with the electrolyte solution of the process 113, which may result in incorporation of humidity and ionic species, depending on the surface condition of the dielectric material 111.

Figure 1E:
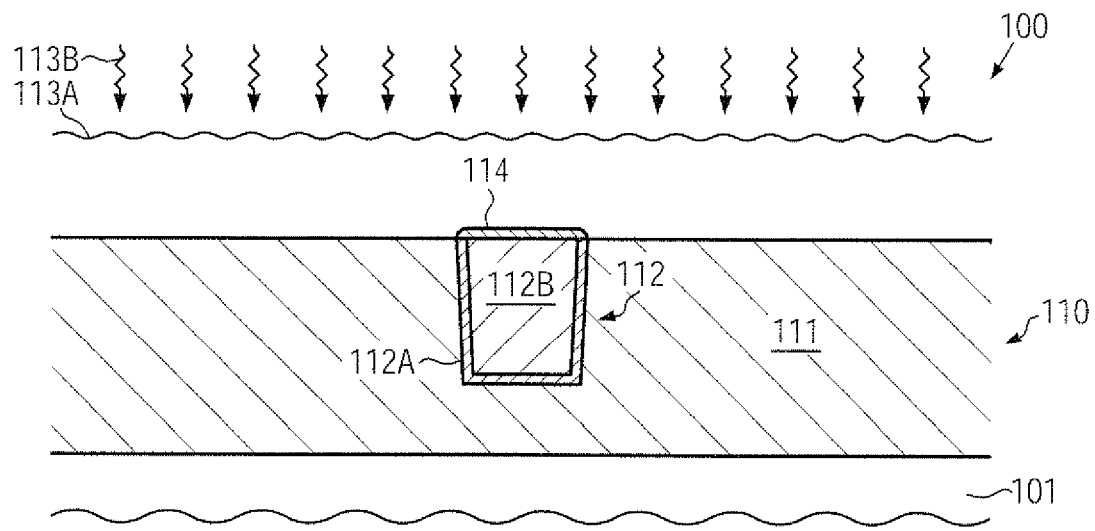

FIG. 1e schematically illustrates the semiconductor device 100 during a further process in completing the formation of the metal cap layer 114. As shown, typically, the exposed surface of the device 100 may be rinsed during a process 113A by, for instance, de-ionized water and the like. Thereafter, the exposed surface of the device 100 may be dried in a process step 113B, which may typically be performed under clean room atmospheric conditions. Contrary to conventional strategies, in the present disclosure, the cleaning of the surface of the device 100 by means of the processes 113A and 113B may be considered inappropriate, thus, prior to and/or after the process sequence including the processes 113, 113A, 113B, an appropriately designed heat treatment may be performed. For example, in one illustrative embodiment, the heat treatment 130 (see FIG. 1c) may be performed, thereby achieving a superior surface condition of the dielectric material 111 and possibly of the metal 112B, thereby also reducing any negative effect that may result in increased leakage currents during conventional approaches when the cap layer 114 may be formed without an appropriately positioned heat treatment during the overall manufacturing flow.

Figure 1F:
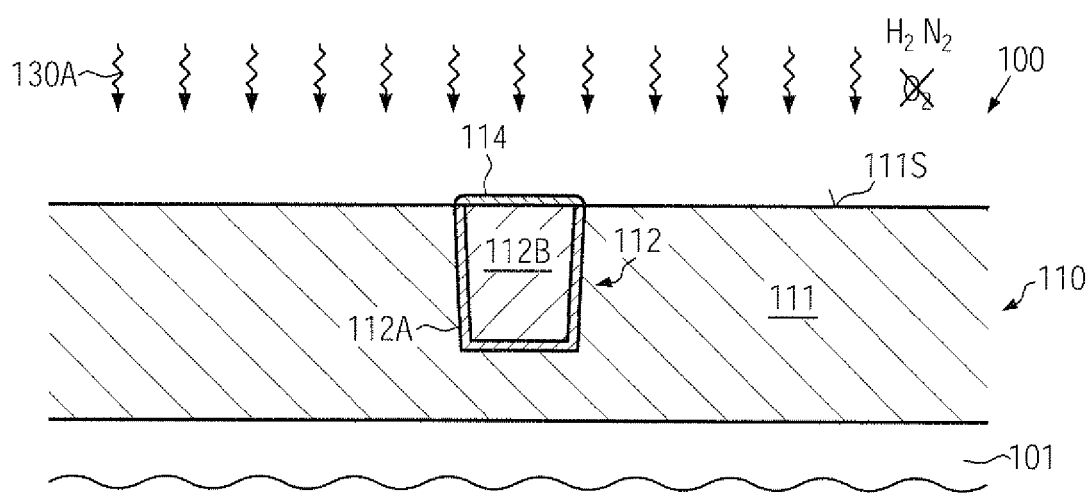
FIG. 1f schematically illustrates the semiconductor device during a heat treatment after forming the metal cap layer and prior to forming further manufacturing processes, according to illustrative embodiments.

FIG. 1f schematically illustrates the semiconductor device 100 according to further illustrative embodiments wherein, in addition or alternatively to the heat treatment 130 (FIG. 1c), a further heat treatment 130A may be performed on exposed surface portions 111S of the dielectric material 111 and the metal region 112 comprising a metal cap layer 114. The heat treatment 130A may be performed on the basis of process parameters, such as temperatures in the range of 100-400° C. with a duration of approximately 3-120 minutes. Furthermore, in some illustrative embodiments, an oxygen-depleted ambient may be established during the process 130A, while in other cases a reducing ambient may be used, as is also explained above with reference to the heat treatment 130.

Figure 1G:
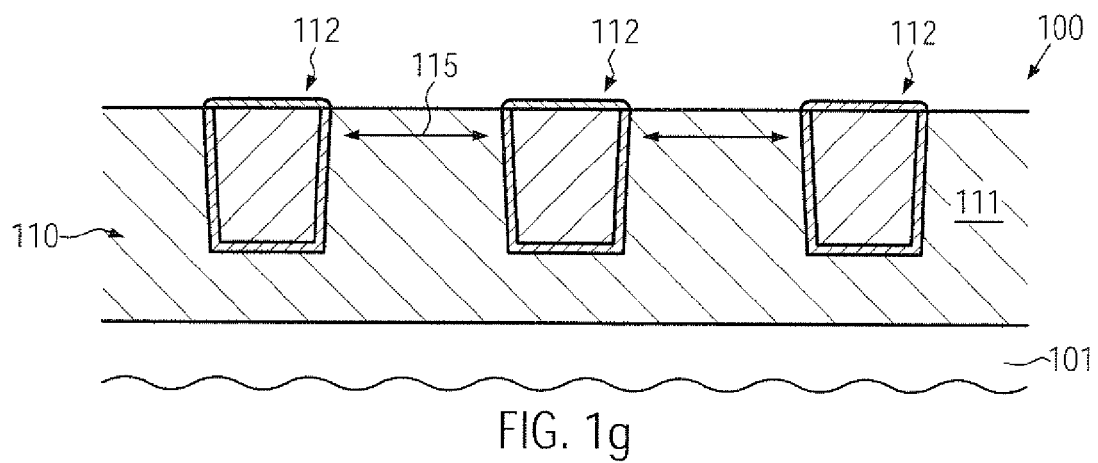
FIG. 1g schematically illustrates a cross-sectional view of a plurality of metal regions having enhanced leakage current behavior as may be determined by test measurements after the heat treatment of FIG. 1f.

FIG. 1g schematically illustrates the semiconductor device 100 wherein a plurality of metal regions 112 may be provided in the device level 110, which may be formed in accordance with the process flow described above with reference to FIGS. 1a-1f. That is, in some illustrative embodiments, at least one of the heat treatments 130 and 130A may be performed, while in other illustrative embodiments both heat treatments 130, 130A may be applied to the semiconductor device 100. It should be appreciated that the portion of the device layer 110 as shown in FIG. 1g may correspond to a test structure when a verification of the electrical characteristics of the device level 110 may be required at this manufacturing stage. For instance, a test with respect to leakage currents 115 between neighboring metal regions 112 may be used in order to verify whether or not the corresponding specifications are met. In other cases, well-established electrical tests with a ramped voltage may be applied in order to determine an electrical breakdown of the dielectric material 111.

Figure 1H:
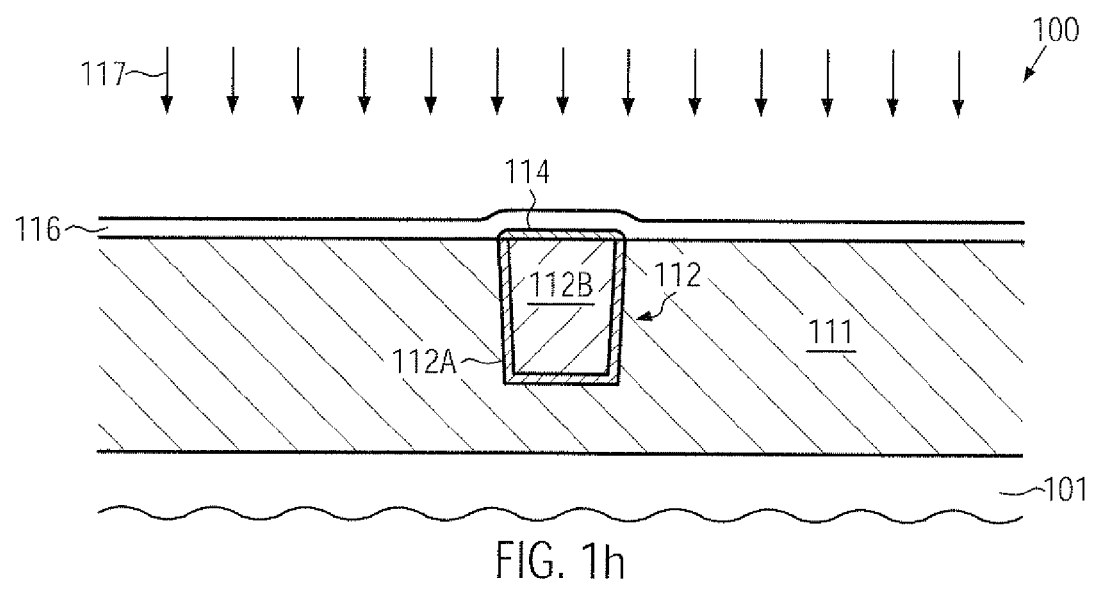
FIG. 1h schematically illustrates the semiconductor device during the deposition of a further dielectric material, according to illustrative embodiments.

FIG. 1h schematically illustrates the semiconductor device 100 in a further advanced manufacturing stage in which a further dielectric material 116 may be formed on or above the dielectric material 111 and on or above the metal region 112, i.e., the cap layer 114. The dielectric material 116 may be provided during any appropriate deposition process 117, such as a CVD process and the like, thereby depositing any appropriate material or material composition, such as silicon nitride, nitrogen-containing silicon carbide, silicon carbide, silicon dioxide and the like. In some illustrative embodiments, the scheduling of the manufacturing flow for forming the semiconductor device 100 may be appropriately adjusted with respect to a queue time of the device 100 prior to the deposition process 117. That is, in illustrative embodiments in which the heat treatment 130A (FIG. 1f) may be performed, the overall process flow may be controlled such that after the heat treatment 130A, a queue time prior to performing the deposition process 117 may be less than a predefined threshold in order to avoid undue degradation of the exposed surface 111S (FIG. 1f) previously conditioned during the heat treatment 130A of FIG. 1f. For instance, in some illustrative embodiments, the corresponding queue time for the device may be approximately 5 hours or less.

After the deposition process 117, the further processing may be continued, for instance, by depositing a further dielectric material for a subsequent metallization level, if required. Thus, the process sequence described above, comprising at least one of the heat treatments 130A, 130, may provide enhanced leakage performance of the resulting metallization level, such as the device level 110, which may have at least comparable electric characteristics with respect to manufacturing strategies in which metal regions may be confined by a dielectric cap layer so as to avoid yield loss compared to conventional strategies for forming a metal cap layer. Consequently, due to the comparable or even enhanced leakage behavior of the device level 110, the enhanced electromigration performance provided by appropriate conductive cap layers may further increase the overall performance of the device 100. Furthermore, the principles disclosed herein may readily be applied to device generations in which reduced lateral dimensions may be required.

With reference to FIGS. 1i-1l, further illustrative embodiments will now be described in which one or more heat treatments, such as the treatments 130, 130A, may be applied at different device levels, thereby also providing enhanced electrical performance.

Figure 1I:
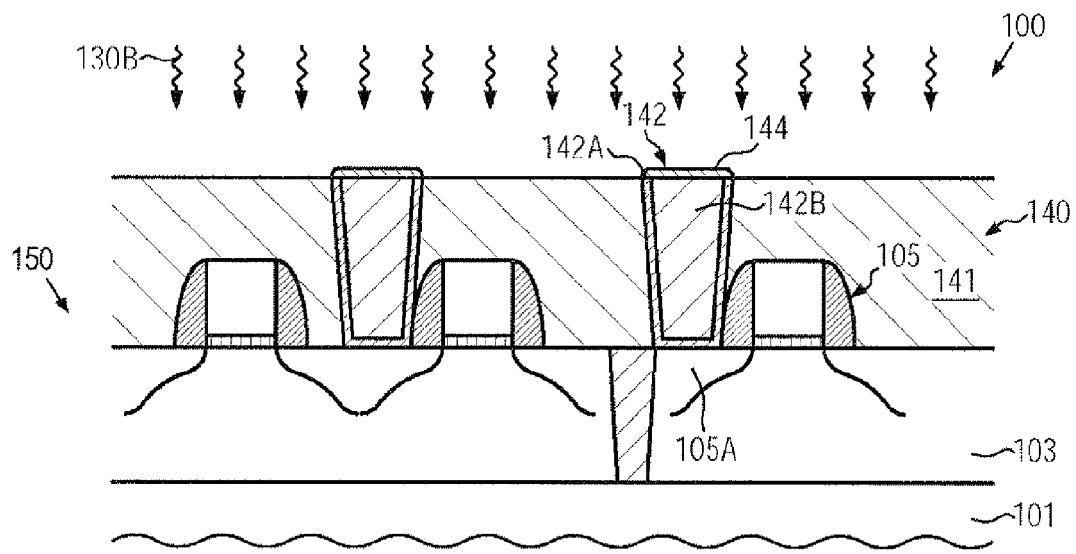
FIG. 1i schematically illustrates a cross-sectional view of the semiconductor device having a contact structure that may be subjected to a heat treatment, according to still further illustrative embodiments.

FIG. 1i schematically illustrates the semiconductor device 100 comprising a semiconductor layer 103 formed above the substrate 101, in and above which may be provided a plurality of circuit elements 105, for instance in the form of transistors and the like. Furthermore, a contact structure 140 may be formed on the basis of an appropriate dielectric material 141, which may comprise two or more different materials, depending on the overall device requirements. Furthermore, the contact structure 140 may comprise a plurality of contact elements 142, i.e., metal-containing regions, in which, at least partially, a highly conductive metal 142B, such as copper, copper alloy and the like, may be used, in combination with a barrier material 142A. Furthermore, the contact elements 142 may comprise a metal cap layer 144, for instance comprised of any appropriate material providing the desired confinement of the metal 142B and exhibiting the desired electrical characteristics, for instance with respect to conductivity, electromigration and the like.

The semiconductor device 100 as shown in FIG. 1i may be formed by fabricating the circuit elements 105 using well-established process strategies in accordance with the technology under consideration. That is, CMOS techniques and the like may be used, depending on the configuration of the circuit elements 105. Next, the dielectric material 141 may be formed, for instance, by appropriate deposition techniques, which may also include planarization steps in order to provide a desired surface topography. Thereafter, dielectric material 141 may be patterned by using lithography processes and subsequently the barrier layer 142A and the metal 142B may be deposited, which may be accomplished on the basis of similar process techniques as previously described. In some illustrative embodiments, after removing any excess material of metal 142B, possibly in combination with residues of the barrier material 142A, a heat treatment may be performed, as previously described with reference to the treatment 130 (FIG. 1c). Thereafter, the cap layer 144 may be formed by an electrochemical deposition technique, as previously described, which may include cleaning and rinsing the device, as described above. Next, a heat treatment 130B may be performed by using process parameters as previously described. That is, a process temperature of 100-400° C. may be used, possibly in combination with an oxygen-depleted ambient, which may additionally comprise a reducing agent. With a duration of 3-120 minutes, a desired conditioning effect may be obtained, as previously described. Consequently, the contact elements 142 may provide a highly conductive path to a contact area 105A of the circuit elements 105, even for extremely scaled semiconductor devices, by using at least partially a highly conductive metal in the form of the metal 142B, which may be efficiently confined by the cap layer 144 provided on the basis of electrochemical deposition techniques, while nevertheless providing superior leakage current behavior, as previously explained.

Figure 1J:
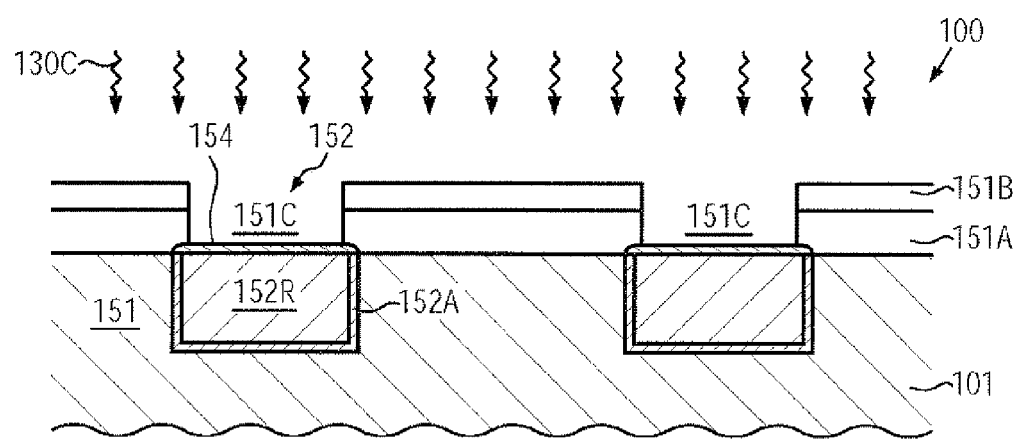
FIGS. 1j-1l schematically illustrate cross-sectional views of the semiconductor device during various manufacturing stages in forming bumps, such as solder bumps, by using electrochemical deposition techniques in combination with heat treatments, according to still further illustrative embodiments.

FIG. 1j schematically illustrates the semiconductor device 100 according to further illustrative embodiments, in which a metallization level 150 may be formed above the substrate 101, which may represent the last metallization layer. Hence, a plurality of metal regions 152 in the form of contact pads may be provided with a dielectric material 151. The metal regions 152 may be comprised of a highly conductive metal, as may also be used in lower lying metal layers, such as copper and the like, possibly in combination with an appropriate barrier material 152A. Furthermore, in the manufacturing stage shown, a conductive cap layer 154 may be formed on the metal 152R, wherein the cap layer 154 may comprise two or more different materials, if required. It should be appreciated that the cap layer 154 may also be referred to as an underbump metallization layer, since it may be used as an interface material for forming thereon a bump, such as a solder bump, which may be used for connecting the device 100 to a package or other carrier material by reflowing the corresponding bumps. For example, the layer 150 may also comprise one or more passivation layers 151A, 151B in the form of any appropriate dielectric material. The passivation layers 151A, 151B may comprise an opening 151C, in which the bump material may be deposited in a later manufacturing stage.

The device 100 as shown in FIG. 1*j* may be formed in accordance with well-established process strategies to provide the metal regions 152 within the dielectric material 151. In some illustrative embodiments, an additional cap layer (not shown) may be formed in accordance with process techniques, as previously described with reference to FIGS. 1*a*-1*i*. In some illustrative embodiments, the dielectric materials 151A, 151B may be deposited and may be patterned in order to form the openings 151C, which may then be used as a deposition mask for a subsequent electrochemical deposition process for forming the cap layer 154 having the required material composition so as to act as an underbump metallization. In other illustrative embodiments, the cap layer 154 may be formed prior to the deposition of the layers 151A, 151B. During the deposition of the cap layer 154, the dielectric material 151 or the dielectric material of the layers 151A, 151B may be exposed to the electrolyte solution, as previously explained, and hence a corresponding heat treatment 130C may be performed, which may be accomplished on the basis of the same process parameter ranges as specified above for the treatments 130, 130A and 130B. Depending on the overall process strategy, after the heat treatment 130C, the layers 151A, 151B may be formed or the treatment 130C may be performed in the presence of the layers 151A, 151B, thereby providing the cap layer 154 locally above a restricted portion of the metal regions 152.

Figure 1K:
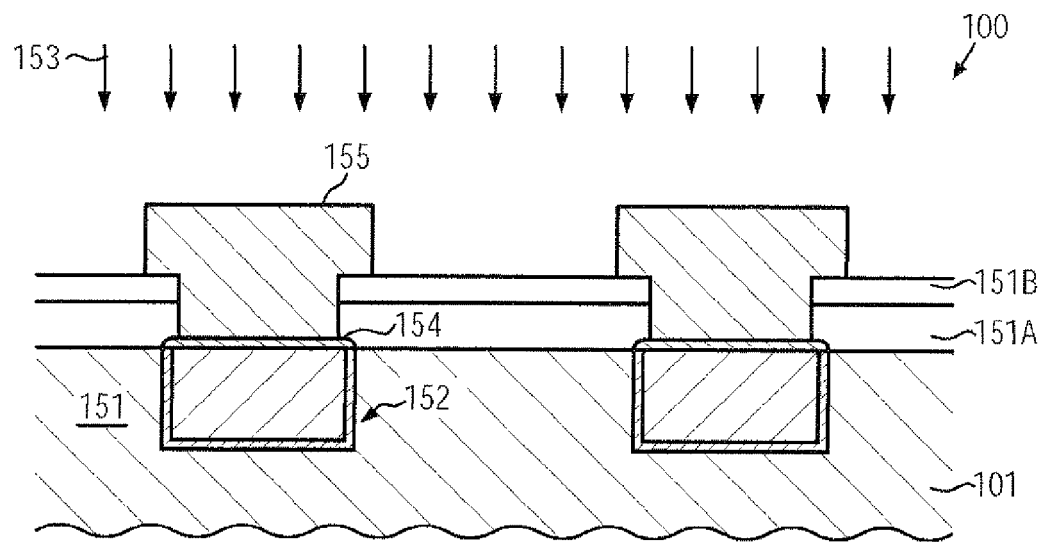

FIG. 1*k* schematically illustrates the semiconductor device 100 during a further electrochemical deposition process 153, thereby forming bumps 155, which may, for instance, be comprised of a solder material or any other appropriate contact material for connecting two respective pads or bumps of a package or carrier material. The electrochemical deposition process 153 may also be performed as an electroless process, wherein the cap layer 154 may, in addition to acting as a mechanical and electrical interface between the metal region 152 and the bump 155, act as a catalyst material for initiating the selective metal deposition. Consequently, by providing the underbump metallization layer 154 in a self-aligned manner, any subsequent removal thereof, as may be the case in conventional strategies, may be avoided. Furthermore, due to the heat treatment 130C (FIG. 1*j*), integrity of the dielectric material 151 or the materials 151A, 151B, depending on the process strategy, may be maintained with respect to leakage current behavior.

Figure 1L:
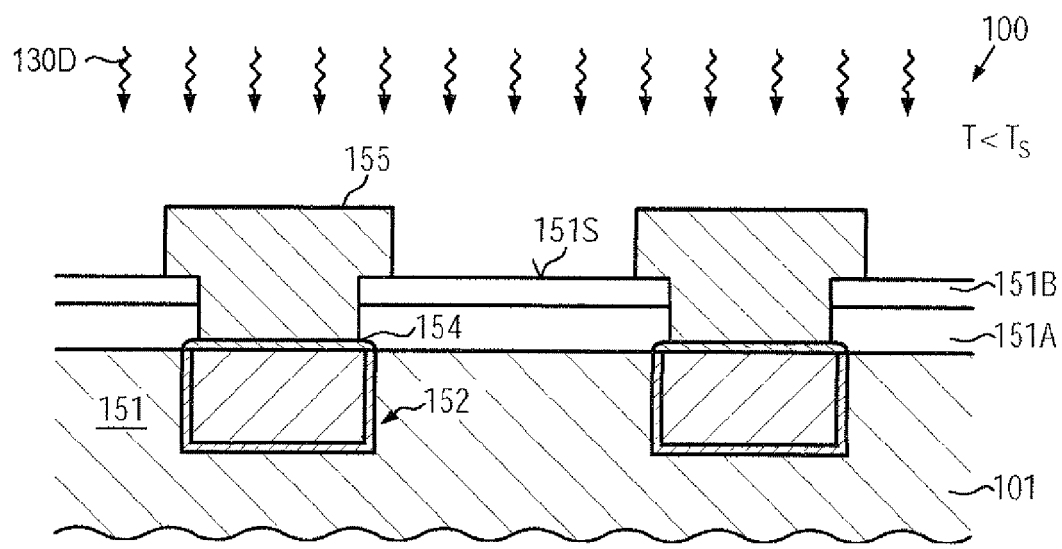

FIG. 1*l* schematically illustrates the semiconductor device 100 according to still further illustrative embodiments in which a further heat treatment 130D may be performed based on similar process conditions, as previously described, in order to condition the exposed surface 151S of the layer 151B, which may have been in contact with the electrolyte solution during the deposition process 153 (FIG. 1*k*). In this case, a process temperature of the heat treatment 130D may be appropriately adjusted with respect to the melting temperature $T_S$ of the bump materials 155 in order to avoid undue deformation of the bumps 155. For example, the process temperature may be selected in the range of 100-200° C., thereby maintaining the process temperature well below melting temperatures of advanced lead-free solder materials.

As a result, the present disclosure provides techniques for enhancing surface conditions of dielectric materials, such as low-k dielectric materials, after contact with a wet chemical agent, such as an electrolyte solution. For this purpose, prior to and/or after contact with the electrolyte solution, a heat treatment may be performed on the basis of an appropriate temperature range, such as approximately 100-400° C., while, in some illustrative embodiments, a depleted oxygen ambient, possibly in combination with a reducing agent, may be established. The heat treatment may be performed in a furnace or a process tool including hot plates or any other process tool providing the desired configuration in order to establish the temperature range and the atmospheric conditions, for instance with respect to the substantially oxygen-free ambient and the like. In some illustrative embodiments, the heat treatment may be appropriately positioned within a manufacturing flow for forming a metal cap layer by electroless plating techniques, thereby obtaining comparable or even superior behavior of the finally obtained metallization level compared to devices of the same configuration without a metal cap layer. The principles disclosed herein may also be applied to any situation in the overall manufacturing flow in which sensitive dielectric materials may be exposed to chemical agents, wherein, after the contact, enhanced performance with respect to leakage currents and dielectric strength may be required. For example, in sophisticated contact levels, a metal cap layer in combination with a highly conductive material, such as copper, may be used so that also in this situation enhanced performance with respect to electromigration and leakage currents may be achieved. Similarly, underbump metallization layers may be efficiently provided on the basis of electrochemical deposition techniques while nevertheless maintaining integrity of the surrounding dielectric materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
performing a process sequence on a semiconductor device, said process sequence including a subset of processes for applying a wet chemical solution on a first dielectric material and removing said wet chemical solution from said dielectric material;
performing a heat treatment in an oxygen-depleted ambient, wherein said oxygen-depleted ambient comprises approximately 50 ppm oxygen or less; and
forming a second dielectric material at least on said first dielectric material after said heat treatment.

2. The method of claim 1, wherein performing said process sequence comprises forming a conductive cap layer on a metal region embedded in said first dielectric material by performing an electrochemical deposition process to deposit said conductive cap layer and performing a cleaning process.

3. The method of claim 1, wherein said heat treatment is performed at a temperature of approximately 100-400° C.

4. The method of claim 3, wherein said heat treatment is performed for approximately 3-120 minutes.

5. The method of claim 1, wherein said first dielectric material comprises a low-k dielectric material.

6. The method of claim 1, wherein said oxygen-depleted ambient comprises a reducing gas.

7. The method of claim 2, further comprising performing a second heat treatment after forming said metal region and prior to forming said conductive cap layer.

8. The method of claim 7, wherein said second heat treatment is performed at a temperature of approximately 100-400° C.

9. The method of claim 8, wherein said second heat treatment is performed in a reducing ambient, in which a fraction of residual oxygen is approximately 50 ppm or less.

10. The method of claim 1, wherein a queue time after completing said heat treatment and prior to starting forming said second dielectric layer is approximately 5 hours or less.

11. The method of claim 2, wherein said metal region connects to a contact area of a circuit element of said semiconductor device.

12. The method of claim 2, further comprising forming a bump on said conductive cap layer.

13. The method of claim 2, wherein said second dielectric material is formed on said conductive cap layer.

14. A method, comprising:
performing a first heat treatment with a process temperature of approximately 100-400° C. on a first dielectric material of a semiconductor device after contact of said first dielectric material with a wet chemical agent, wherein said first heat treatment is performed in an oxygen-depleted ambient comprising approximately 50 ppm oxygen or less; and
forming a second dielectric material on said first dielectric material.

15. The method of claim 14, wherein said first dielectric material comprises a low-k dielectric material.

16. The method of claim 14, further comprising forming a metal region in said first dielectric material prior to performing said first heat treatment.

17. The method of claim 16, wherein said wet chemical agent comprises an electrolyte solution used to form a metal layer on said metal region.

18. The method of claim 16, wherein said wet chemical agent is used for forming said metal region.

19. The method of claim 18, further comprising forming a metal layer on said metal region by an electrochemical deposition process and performing a second heat treatment after forming said metal layer, wherein said first heat treatment is performed prior to forming said metal layer and said second heat treatment is performed in an oxygen-depleted ambient comprising approximately 50 ppm oxygen or less.

20. The method of claim 19, wherein said second heat treatment is performed at a process temperature of approximately 100-400° C.

21. The method of claim 14, wherein said first heat treatment is performed in a reducing ambient.

22. The method of claim 21, wherein said first heat treatment is performed for approximately 3-120 minutes.

23. A method, comprising:
performing a process sequence for forming a metal region in a dielectric material of a metallization system of a semiconductor device, said process sequence comprising at least one process that exposes a surface of said dielectric material to a wet chemical agent;
forming a metal-containing layer on said metal region by performing an electrochemical deposition process, and
performing a first heat treatment in an oxygen-depleted ambient comprising approximately 50 ppm oxygen or less after forming said metal-containing layer.

24. The method of claim 23, further comprising performing a second heat treatment in an oxygen-depleted ambient comprising approximately 50 ppm oxygen or less after said process sequence and prior to forming said metal-containing layer, wherein said first and second heat treatments are performed at a temperature of approximately 100-400° C.

* * * * *